(12) United States Patent
Klem et al.

(10) Patent No.: US 12,379,205 B2
(45) Date of Patent: Aug. 5, 2025

(54) OPTICAL DEPTH SENSING SYSTEMS USING HIGH SPEED COLLOIDAL QUANTUM DOT PHOTODETECTORS

(71) Applicant: SWIR Vision Systems Inc., Durham, NC (US)

(72) Inventors: Ethan J. D. Klem, Chapel Hill, NC (US); Christopher William Gregory, Chapel Hill, NC (US); Jeffery Allan Hilton, Jr., Durham, NC (US); Carmen Procida, Durham, NC (US); Michael Bond, Morrisville, NC (US); Tewodros Tessema, Durham, NC (US)

(73) Assignee: SWIR Vision Systems Inc., Scottsdale, AZ (US)

(*) Notice: Subject to any disclaimer, the term of this patent is extended or adjusted under 35 U.S.C. 154(b) by 275 days.

(21) Appl. No.: 18/060,171

(22) Filed: Nov. 30, 2022

(65) Prior Publication Data

US 2023/0168078 A1 Jun. 1, 2023

Related U.S. Application Data

(60) Provisional application No. 63/284,846, filed on Dec. 1, 2021.

(51) Int. Cl.
*G01B 11/22* (2006.01)
*H10K 39/30* (2023.01)
*B82Y 20/00* (2011.01)

(52) U.S. Cl.
CPC ............. *G01B 11/22* (2013.01); *H10K 39/30* (2023.02); *B82Y 20/00* (2013.01)

(58) Field of Classification Search
CPC ....... G01B 11/22; G01S 17/88; G01S 17/984; G01N 33/588
See application file for complete search history.

(56) References Cited

U.S. PATENT DOCUMENTS

| | | | |
|---|---|---|---|
| 2020/0256960 A1* | 8/2020 | LaChapelle | G01S 7/4863 |
| 2020/0357939 A1 | 11/2020 | Law et al. | |
| 2020/0389299 A1* | 12/2020 | White | H04B 10/85 |
| 2021/0288195 A1 | 9/2021 | Klem et al. | |

(Continued)

FOREIGN PATENT DOCUMENTS

| | | | | |
|---|---|---|---|---|
| GB | 2582765 A | * | 10/2020 | ....... H01L 31/02019 |
| JP | 2020077861 A | | 5/2020 | |

(Continued)

OTHER PUBLICATIONS

Prins et al.; "Fast and Efficient Photodetection in Nanoscale Quantum-Dot Junctions"; Nov. 14, 2012; Nano Letters, vol. 12, Issue 11, p. 5740-5743 (Year: 2012).*

(Continued)

*Primary Examiner* — Michelle M Iacoletti
*Assistant Examiner* — Clark David Hovis
(74) *Attorney, Agent, or Firm* — Slayden Grubert Beard PLLC (57) ABSTRACT

An optical depth sensing system is provided including an active illumination source; and a colloidal quantum dot photodetector. The colloidal quantum dot photodetector having colloidal quantum dots as a light sensing elements and the system has rise times that are less than 5.0 ns and fall times less than 10.0 ns.

12 Claims, 7 Drawing Sheets

(56) References Cited

U.S. PATENT DOCUMENTS

2021/0359147 A1   11/2021   Shulga et al.
2022/0231244 A1    7/2022   Klem et al.

FOREIGN PATENT DOCUMENTS

WO        2020160370    A1   8/2020
WO    WO-2020160370      *   8/2020   ......... H01L 31/1828
WO        2021172986    A1   9/2021

OTHER PUBLICATIONS

Notification of Transmittal of the International Search Report and Written Opinion, PCT/US2022/080635, Apr. 5, 2023, 9 pages.

* cited by examiner

10%-90% RISE/FALL TIME MEASURED DATA USING AGILENT OSCILLOSCOPE

| | CQD PHOTODIODE | | InGaAs PHOTODIODE | |
|---|---|---|---|---|
| | RISE TIME(2) | FALL TIME(2) | RISE TIME(1) | FALL TIME(1) |
| CURRENT | 890 ps | 2.82 ns | 2.47 ns | 5.87 ns |
| MEAN | 1.012 ns | 2.786 ns | 2.456 ns | 5.784 ns |
| MIN | 850 ps | 2.3 ns | 2.37 ns | 5.44 ns |
| MAX | 1.43 ns | 3.48 ns | 2.6 ns | 6.13 ns |
| RANGE | 570 ps | 1.21 ns | 220 ps | 690 ps |
| Std Dev | 115 ps | 163 ps | 29 ps | 84 ps |
| # OF MEAS | 680 | 680 | 680 | 680 |
| EDGE DIR | RISING | FALLING | RISING | FALLING |

CQD PHOTODIODE MEAN RISE TIME: 1.0 ns
CQD PHOTODIODE MEAN FALL TIME: 2.8 ns

OPTICAL DEPTH SENSING SYSTEMS USING HIGH SPEED COLLOIDAL QUANTUM DOT PHOTODETECTORS

CLAIM OF PRIORITY

The present application claims the benefit of and priority to U.S. Provisional Application No. 63/284,846, filed on Dec. 1, 2021, entitled Optical Depth Sensing Systems Using High Speed Colloidal Quantum Dot Photodetectors, the contents of which is hereby incorporated herein by reference as if set forth in its entirety.

FIELD

The present inventive concept relates generally to photodetectors and, more particularly, to colloidal quantum photodetectors and systems including the same.

BACKGROUND

Depth sensing systems utilizing active optical sources and optical detectors to determine the three dimensional structure and distance of objects from the system and within a scene are useful in applications in industrial, scientific, consumer, automotive and security markets. A significant short coming of conventional approaches to building these systems is a lack of a scalable detector structure capable of performing high-speed detection in the near-infrared (NIR) and short wave infrared (SWIR) spectral regions. Photodetectors commonly used today in the NIR and SWIR spectral bands are typically composed of silicon (Si)-based photodetectors, germanium (Ge)-based photodetectors, indium gallium arsenide (InGaAs) photodetectors, mercury cadmium telluride (HgCdTe) detectors, and indium antimonide (InSb) detectors. All of these material systems generally suffer from shortcomings in, for example, their noise performance, cost structure and manufacturability, spectral response range or some combination thereof. Accordingly, improved systems are desired.

SUMMARY

Some embodiments of the present inventive concept provide an optical depth sensing system including an active illumination source; and a colloidal quantum dot photodetector. The colloidal quantum dot photodetector having colloidal quantum dots as a light sensing elements and the system has rise times that are less than 5.0 ns and fall times less than 10.0 ns.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/."

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As used herein, the term "optoelectronic device" generally refers to any device that acts as an optical-to-electrical transducer or an electrical-to-optical transducer. Accordingly, the term "optoelectronic device" may refer to, for example, a photovoltaic (PV) device (for example, a solar cell), a photodetector, a thermovoltaic cell, or electroluminescent (EL) devices such as light-emitting diodes (LEDs) and laser diodes (LDs). In a general sense, EL devices operate in the reverse of PV and photodetector devices. Electrons and holes are injected into the semiconductor region from the respective electrodes under the influence of an applied bias voltage. One of the semiconductor layers is selected for its light-emitting properties rather than light-absorbing properties. Radiative recombination of the injected electrons and holes causes the light emission in this layer. Many of the same types of materials employed in PV and photodetector devices may likewise be employed in EL devices, although layer thicknesses and other parameters must be adapted to achieve the different goal of the EL device.

As used herein, the term "quantum dot" or "QD" refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size. A quantum dot may generally be characterized as a particle, the shape of which may be spheroidal, ellipsoidal, or other shape. The "size" of the quantum dot may refer to a dimension characteristic of its shape or an approximation of its shape, and thus may be a diameter, a major axis, a predominant length, etc. The size of a quantum dot is on the order of nanometers, i.e., generally ranging from 1.0-1000 nm, but more typically ranging from 1.0-100 nm, 1.0-20 nm or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface or may be functionalized with other chemical moieties for a specific purpose.

For purposes of the present disclosure, the spectral ranges or bands of electromagnetic radiation are generally taken as follows, with the understanding that adjacent spectral ranges or bands may be considered to overlap with each other to some degree: ultra-violate (UV) radiation may be considered as falling within the range of about 10-400 nm, although in practical applications (above vacuum) the range is about 200-400 nm. Visible radiation may be considered as falling within the range of about 380-760 nm. Infrared (IR) radiation may be considered as falling within the range of about 750-100,000 nm. IR radiation may also be considered in terms of sub-ranges, examples of which are as follows. Short wave infrared (SWIR) radiation may be considered as falling within the range of about 1,000-3,000 nm. Medium wave infrared (MWIR) radiation may be considered as falling within the range of about 3,000-5,000 nm. Long range infrared (LWIR) radiation may be considered as falling within the range of about 8,000-12,000 nm.

As discussed below, quantum dot photodiode (QDP) technology is implemented to provide low-cost nanotechnology-enabled photodetectors. In some implementations, the photodetectors may be configured to efficiently detect light with sensitivity spanning a spectral region ranging from about 250-2400 nm. Thus, the QD photodetectors may be configured as a multispectral device capable of producing images from incident ultraviolet (UV), visible and/or infrared (IR) electromagnetic radiation. In some implementations, the spectral range of sensitivity may extend down to X-ray energies and/or up to IR wavelengths longer than 2400 nm. The photodetectors as taught herein are cost effective, scalable to large-area arrays, and applicable to flexible substrates.

As used herein, "dark current" refers to the residual electric current flowing in a photoelectric device when there is no incident illumination. In physics and in electronic engineering, dark current is the relatively small electric current that flows through photosensitive devices such as a photomultiplier tube, photodiode, or charge-coupled device even when no photons are entering the device. The dark current generally consists of the charges generated in the detector when no outside radiation is entering the detector. It can be referred to as reverse bias leakage current in non-optical devices and is present in all diodes. Physically, on source dark current is due to the random generation of electrons and holes within the depletion region of the device.

As used herein, the term "fullerene" refers to the buckminsterfullerene $C_n$ as well as other forms of molecular carbon, such as $C_{70}$, $C_{84}$, and similar cage-like carbon structures, and more generally may range from 20 to several hundreds of carbon atoms, i.e., $C_n$ where n is 20 or greater. The fullerene may be functionalized or chemically modified as desired for a specific purpose such as, for example, improving solubility or dispersability or modifying the electrical properties of the fullerene. The term "fullerene" may also refer to endohedral fullerenes wherein a non-carbon atom or atomic cluster is enclosed in the carbon cage. The term "fullerene" may also refer to fullerene derivatives. A few non-limiting examples of fullerene derivatives are [6,6]-phenyl-$C_{61}$-butyric acid methyl ester (PCBM) and phenyl-$C_{61}$-butyric acid cholesteryl ester (PCBCR). The term "fullerene" may also refer to blends of the previously mentioned forms of fullerenes.

As used herein, a "p-n junction" refers to an interface or a boundary between two semiconductor material types, namely the p-type and the n-type, inside a semiconductor. In a p-type semiconductor, the majority carriers are holes, and the minority carriers are electrons. In an n-type semiconductor, electrons are majority carriers, and holes are minority carriers. Semiconductors like germanium or silicon doped with any of the trivalent atoms like boron, indium or gallium may be p-type semiconductors. Phosphorus, arsenic, antimony, bismuth and the like are used to produce n-type semiconductors.

As discussed above, depth sensing systems utilizing active optical sources and optical detectors to determine the three dimensional structure and distance of objects from the system and within a scene are useful in applications in industrial, scientific, consumer, automotive and security markets. A significant short coming of conventional approaches to building these systems is a lack of a scalable detector structure capable of performing high-speed detection in the near-infrared (NIR) and short wave infrared (SWIR) spectral regions. Photodetectors commonly used today in the NIR and SWIR spectral bands are typically composed of silicon (Si)-based photodetectors, germanium (Ge)-based photodetectors, indium gallium arsenide (InGaAs) photodetectors, mercury cadmium telluride (HgCdTe) detectors, and indium antimonide (InSb) detectors. All of these material systems generally suffer from shortcomings in, for example, their noise performance, cost structure and manufacturability, spectral response range or some combination thereof.

Accordingly, some embodiments of the present inventive concept provide an optical depth sensing system including a high speed photodetector based on colloidal quantum dots as the light sensing element or elements. Depth sensing systems in accordance with embodiments herein utilizes an active photon source, such as a laser or light emitting diode (LED) to produce photons in the NIR or SWIR spectral region.

Other detector structures have been built using colloidal quantum dot materials, but none of these detectors have demonstrated the bandwidth and response time needed for accurate time-of-flight (ToF) depth sensing. Furthermore, none of the available detector structures have been used in a demonstration of a time of an optical depth sensing system using direct mode time of flight measurements.

As discussed herein, the colloidal quantum dot photodetector structure is combined with an active illumination source to produce an optical depth sensing system. The active illumination source may be, for example, a laser or LED. The system measures distances based on the measured return reflection of the active optical source as detected by the colloidal quantum dot high speed detector. It may be operated in a number of configurations. Example configurations are discussed below:

By way of first example, the system may be operated in a direct time of flight configuration that utilizes the accurate detection and measurement of the amplitude, time, frequency, and related characteristics of a reflected optical pulse. As used herein, time of flight (ToF) refers to the measurement of the roundtrip time taken by an optical pulse to travel from an optical source to an object and back to a photodetector that is co-located with the optical source. This time information can then be used in conjunction with the speed of light to determine the distance of the object from the ToF system By way of second example, the system may be operated in an indirect time of flight configuration that relies on the measurement and detection of the phase shift of the reflected optical signal when compared to the phase of the emitted optical signal.

Further, the system may be operated using the measurement and detection of a frequency shift of a reflected optical system as compared to the frequency of the emitted optical signal.

Finally, the system may be operated based on the measurement and detection of an array of emitted optical patterns such as grid of laser dots in what is commonly known as a structured light depth sensing system. It will be understood that embodiments of the present inventive concept are not limited to these examples.

In all the configurations discussed above, these depth/distance measurement systems can benefit from the advantages found in building the system using a high speed colloidal quantum dot photodetector in accordance with some embodiments of the present inventive concept.

The colloidal quantum dot photodiode structure discussed herein is able to provide sufficient bandwidth, response time, thermal operating limits, manufacturability, and cost scalability generally required of optical depth sensing solutions in industrial, consumer, and automotive systems.

The colloidal quantum dot photodiode structure discussed herein has defining characteristics that give rise to its technical and commercial advantages over previous work. For example, these characteristics include the design and fabrication of a p-n photodiode structure that operates with diffusion dominated charge transport characteristics. For example, it may be designed and built to have a small depletion region, for example, less than 50 nm thick, with a diffusion transport region between 50 nm and 250 nm in length.

Furthermore, it can be operated at low bias voltages, for example, between 0 mV and 1000 mV of applied bias. This low operating bias leads to superior temporal response and dark noise performance as compared to other approaches for building colloidal quantum dot photodetectors. Specifically, it exhibits rise times that are less than 5.0 ns and fall times less than 10.0 ns. As used herein, "rise time" refers to the length of time it takes a signal to rise from 10% to 90% of its full scale value. Similarly, as used herein, "fall time" refers to the length of time it takes a signal to fall from 90% to 10% of its full scale value.

The dark current characteristics of the colloidal quantum dot photodiodes discussed herein are also superior to conventional devices. Low dark current is an advantage for optical depth sensing systems because dark current strongly contributes to the amount of background noise present in the system. As a consequence, dark current strongly influences the design and performance of the sensing system. For example, detector dark current can place requirements on the optical source in the system to produce enough optical power to overcome the dark noise of the detector. The colloidal quantum dot photodiodes demonstrated here have dark currents less than 50 $nA/cm^2$ at 25° C. These dark currents are measured at the same applied bias voltage as the detector is operated during is photodetection operation. In other words, the externally applied bias voltage during photodetection operation is the same value of externally applied bias voltage employed during dark signal measurement.

In some embodiments, the colloidal quantum dot high speed photodiode detector structure is designed as a photovoltaic junction wherein the extraction of photo-generated charge carriers into an external circuit does not require the application of a bias voltage. This is due to the internally generated electric fields and charge carrier diffusion gradients being sufficient for extraction of photogenerated charges. This colloidal quantum dot-based photovoltaic p-n junction has the benefit of avoiding the very long time signal transients, i.e. signal decay time, typically seen with other types of colloidal quantum dot photodetectors. It is one of the prime contributors to the extremely fast optical response times measured in this depth sensing system.

Figure 1:
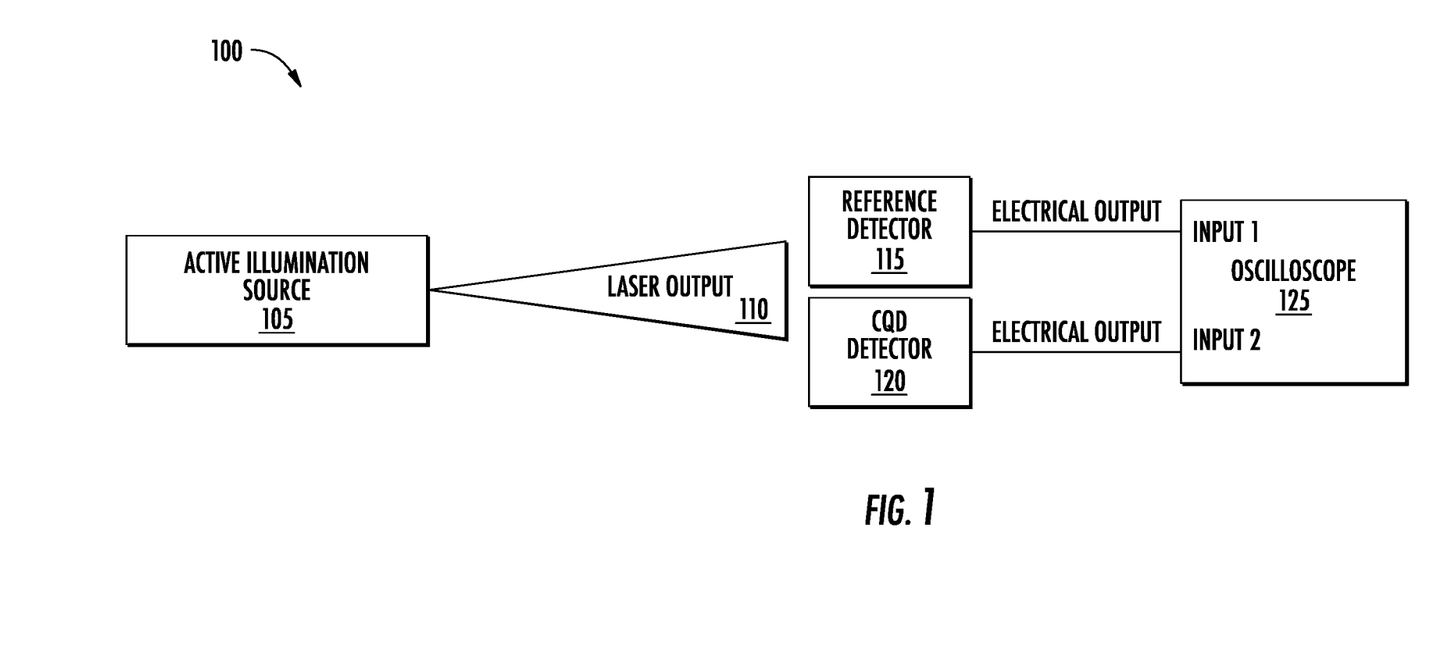
FIG. 1 is a block diagram illustrating a system used in a colloidal quantum dot photodetector response time measurement.

Referring now to FIG. 1, a block diagram illustrating a system using colloidal quantum dot photodetectors in an optical depth sensing system. As illustrated in FIG. 1, the system includes an active illumination source 105, a reference detector 115, a high speed photodetector including colloidal quantum dots 120 and an oscilloscope 125. The active illumination source 105 may be, for example, a laser or an LED. In FIG. 1, the active illumination source is a Nd:Neodymium doped Yttrium Aluminum Garnet (YAG) pulsed laser. As illustrated, the Nd:YAG laser produces a laser output 110, for example, it emits a series of laser pulses that travel through the air to illuminate a colloidal quantum dot photodiode detector 120 and an InGaAs photodiode that is used as a reference detector 115 in embodiments illustrated in FIG. 1. In illustrated embodiments, the Nd:YAG laser 105 has a 3.0-5.0 ns full-width half-maximum pulse width and is configured to operate at a 5 Hz repetition rate and a 1064 nm wavelength. The colloidal quantum dot photodiode is a 0.2 mm×0.2 mm square detector whose electrical output is connected to an oscilloscope 125, for example, Agilent part number MSO8104A, as shown. The InGaAs reference photodiode 115 is a 0.15 mm diameter detector, for example, Thorlabs part number FGA015, whose electrical output is also connected to the oscilloscope 125 as shown and is used as the trigger source for the oscilloscope measurements.

The colloidal quantum dot photodiode 120 may be a SWIR Visions systems photodiode, for example, 200 um×200 um, but are not limited thereto. Further, the connectors between devices may be coaxial cables without departing from the scope of the present inventive concept.

The system 100 of FIG. 1 is provided to demonstrate the functionality of the colloidal quantum dot detector-based optical depth sensor system in accordance with some embodiments of the present inventive concept. As shown, a colloidal quantum dot photodiode 120 was used to measure the rise and fall time characteristics of a laser pulse 110. Data collected from the system in FIG. 1 will now be discussed with respect to FIGS. 2 and 3.

Figure 2:
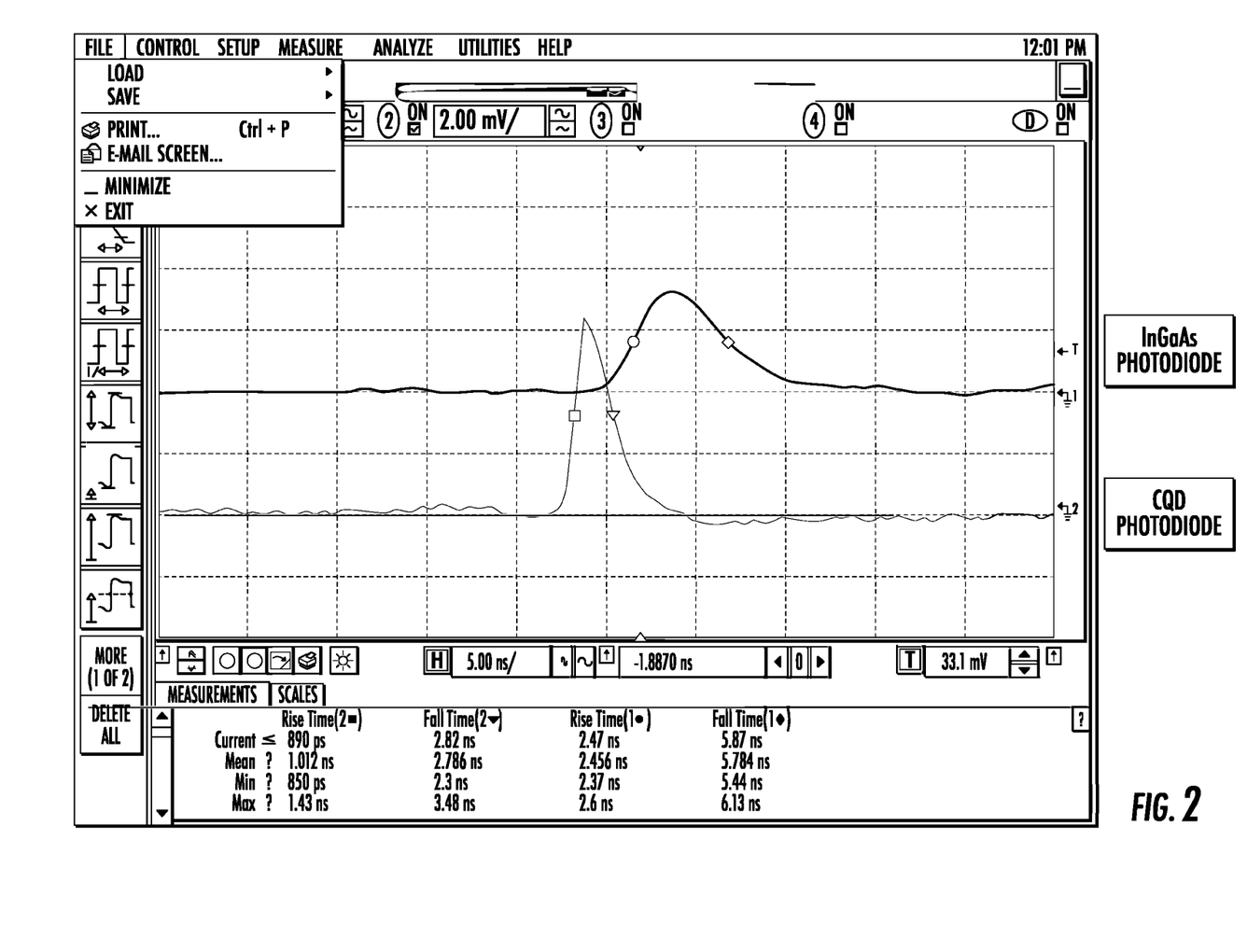
FIG. 2 is an example screen shot of the oscilloscope display when measuring the output of the InGaAs photodiode reference detector and the colloidal quantum dot photodiode as illuminated with a pulsed laser source shown in FIG. 1 in accordance with some embodiments of the present inventive concept.
Figure 3:
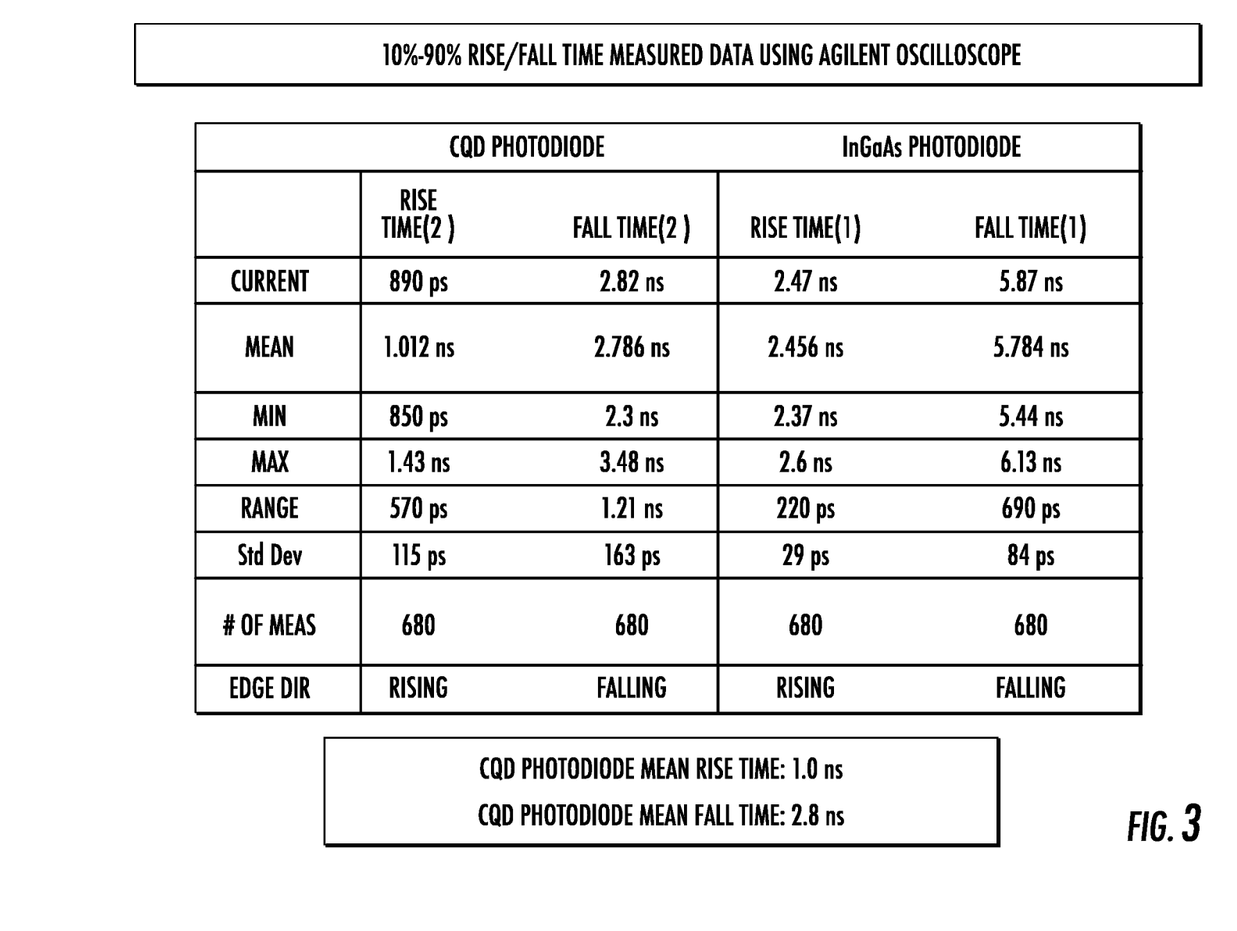
FIG. 3 is a table illustrating measurement data recorded by the oscilloscope of FIG. 1 reporting the mean rise/fall times along with additional measurement statistics in accordance with some embodiments of the present inventive concept.

In particular, FIG. 2 is a screen shot of the oscilloscope display illustrating output of an InGaAs photodiode reference detector and the colloidal quantum dot photodiode in accordance with embodiments discussed herein. During this measurement the oscilloscope was configured to measure the 10%-90% rise times and the 90%-10% fall times for the reference detector and the colloidal quantum dot detector. The mean rise/fall times along with additional measurement statistics are illustrated in FIG. 3. This measurement data was reported by the oscilloscope. It shows that the colloidal quantum dot detector had a mean rise time of 1.01 ns and a mean fall time of 2.79 ns. Both the rise and fall times were shorter than that measured using the InGaAs reference detector. The measurement of rise and fall times less than 5 ns using the colloidal quantum dot detector illustrates that embodiments of the present inventive concept have time response characteristics needed for depth sensing systems.

Figure 4A:
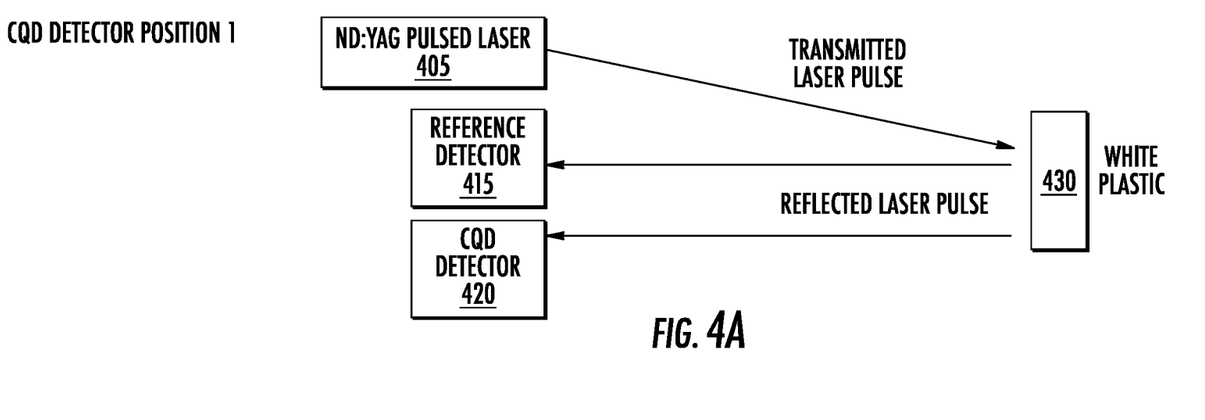
FIGS. 4A and 4B are diagrams illustrating an example setup used for a demonstration of a colloidal quantum dot detector optical depth measurement system in accordance with some embodiments of the present inventive concept.
Figure 4B:
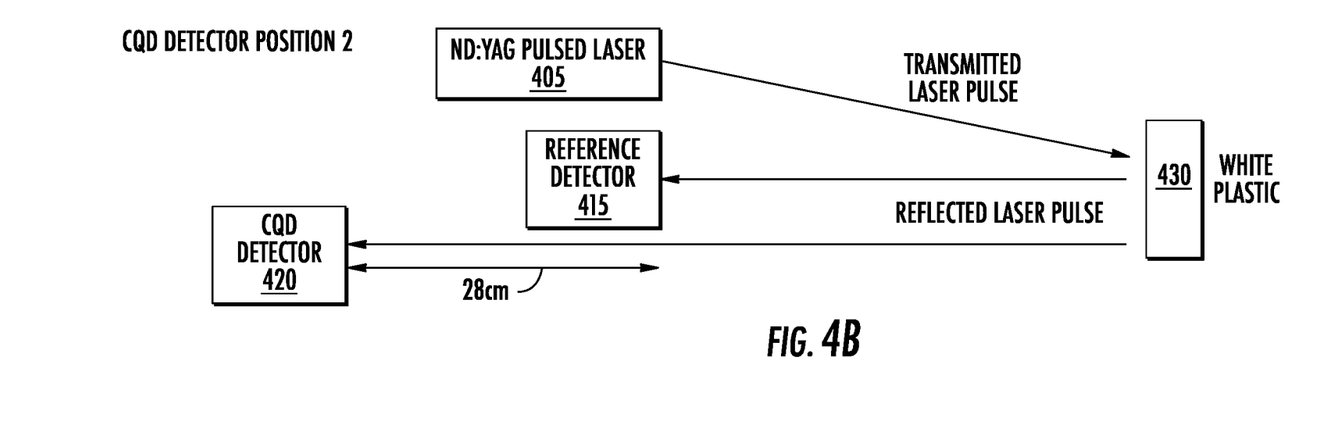

To carry out a demonstration of a colloidal quantum dot detector optical depth measurement system in accordance with some embodiments of the present inventive concept, an example system is illustrated in FIGS. 4A and 4B. As illustrated, the system includes an active illumination source 405, for example, a laser or LED; a reference detector 415 and a colloidal quantum dot detector 420. The system is used to illuminate a piece of white plastic 430. In this two-part measurement, a laser pulse (transmitted laser pulse in FIG. 4A) was used to illuminate the piece of white, opaque plastic 430. The laser pulse then reflected (reflected laser pulse in FIG. 4A) off the plastic 430 and the reflected light is detected by both the reference detector 415 and colloidal quantum dot detector 420. The electrical outputs of both detectors 415 and 420 were measured by an oscilloscope (not shown—see FIG. 1, 125). The detectors 415 and 420 and oscilloscope 125 used for this measurement were similar to those discussed with respect to FIG. 1.

As illustrated in FIG. 4A, in part one of the measurement, the reference detector 415 and the colloidal quantum dot detector 420 were co-located the same distance from the reflective white plastic surface 420. As illustrated in FIG. 4B, in part two of this measurement the colloidal quantum dot detector 420 was moved to 28 cm from the reference detector position 415. This resulted in a 28 cm path-length difference for the optical pulse (reflected laser pulse) to travel before being detected by the colloidal quantum dot detector 420.

Figure 5A:
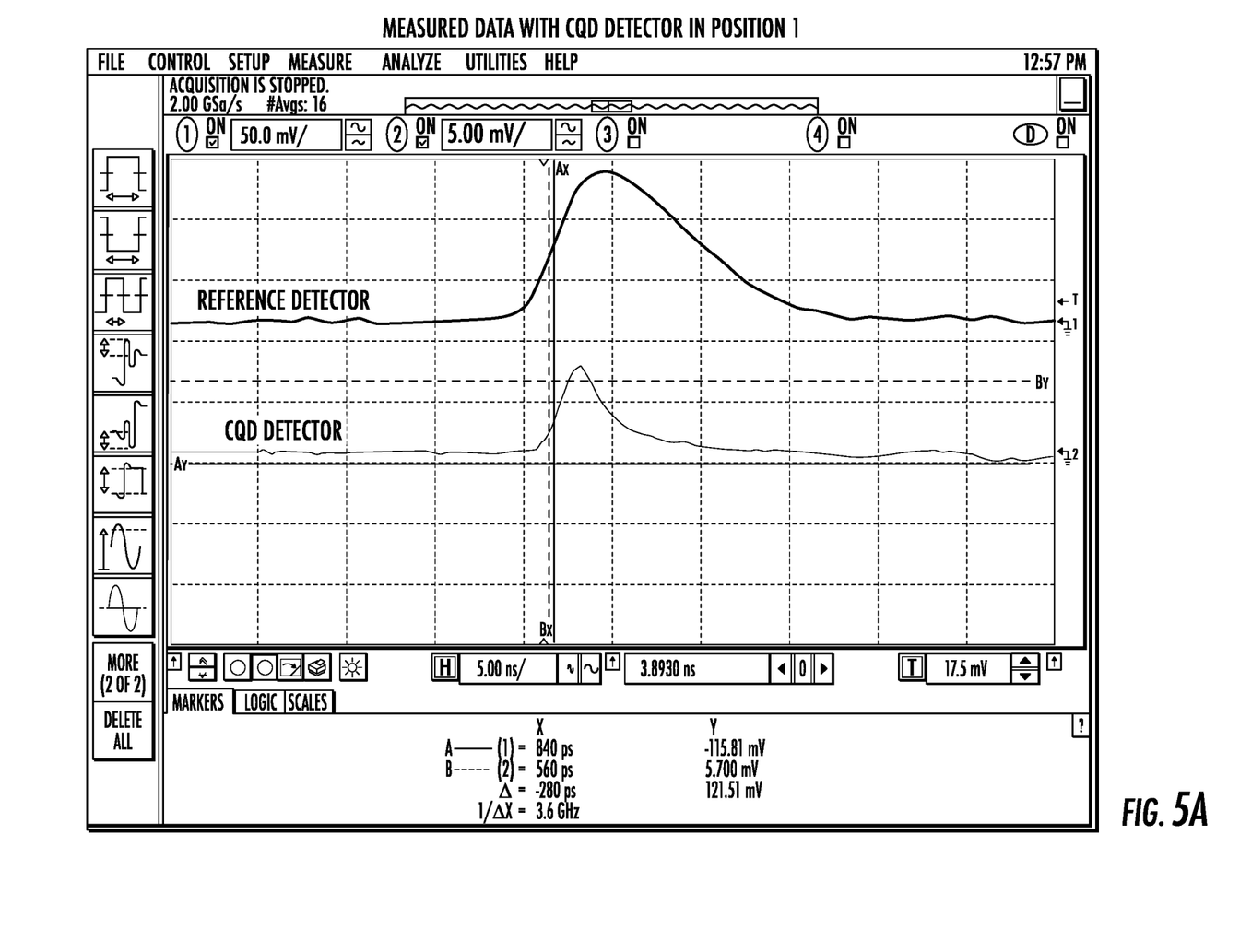
FIGS. 5A and 5B are oscilloscope screen shots taken of the colloidal quantum dot and reference detector electrical outputs in position 1 (5A) and position 2 (5B) in accordance with some embodiments of the present inventive concept.
Figure 5B:
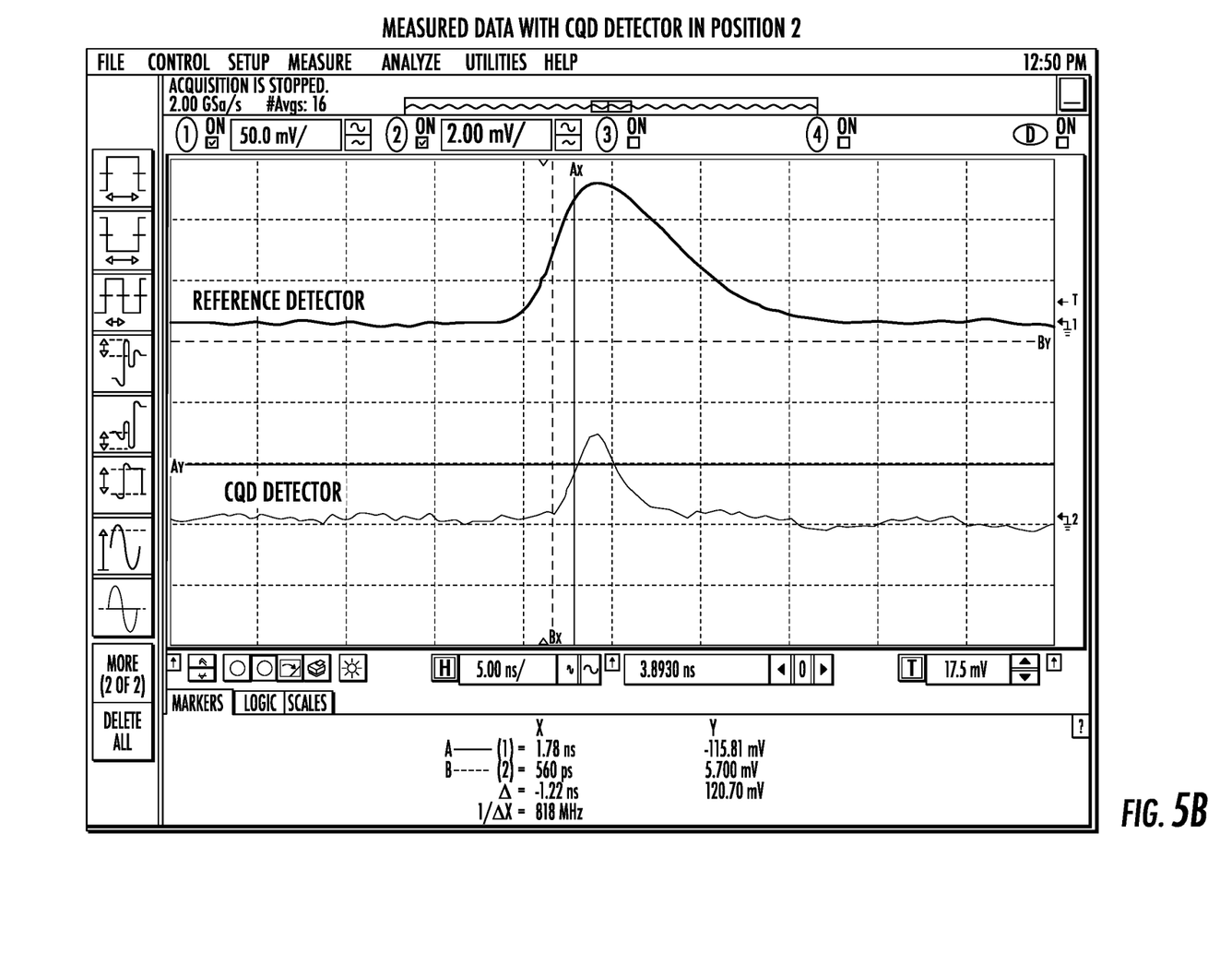

FIGS. 5A and 5B are screen shots taken of the colloidal quantum dot and reference detector electrical output in position 1 (FIG. 4A) and position 2 (FIG. 4B). In position 1 (FIG. 4A), the detectors are co-located. In position 2 the detectors are 28 cm apart. The time difference between the 50% signal level on the rising edge of the two detector outputs was measured using the oscilloscope for both detector positions. The change in the arrival time difference between the two measurements was 0.94 ns. This 0.94 ns shift in pulse arrival time arose because the distance the light pulse had to travel through free-space was increased by 28 cm between the two measurements.

The following equation represents a calculation to estimate the change in optical path length that arises from the 0.94 ns change in pulse arrival time measured in FIGS. 5A and 5B:

$$d = ct \qquad \text{Eqn. (1)}$$

where d is the change in distance, c is the speed of light and t is the change in time. Filling in the values:

$$d = 2.997E8 \text{ m/s} * 0.94E{-9} \text{ s}$$

$$d = 0.282 \text{ m}$$

$$d = 28.2 \text{ cm}$$

Thus, using the velocity of light in air one can calculate that in 0.94 ns the optical pulse is expected to travel 28.2 cm. This corresponds well to the measured change in optical path length of 28 cm. Accordingly, these measurements illustrate that an optical depth sensing system with colloidal quantum dot detectors can be implemented to measure distance in time of flight three dimensional (3D) depth sensing.

Figure 6:
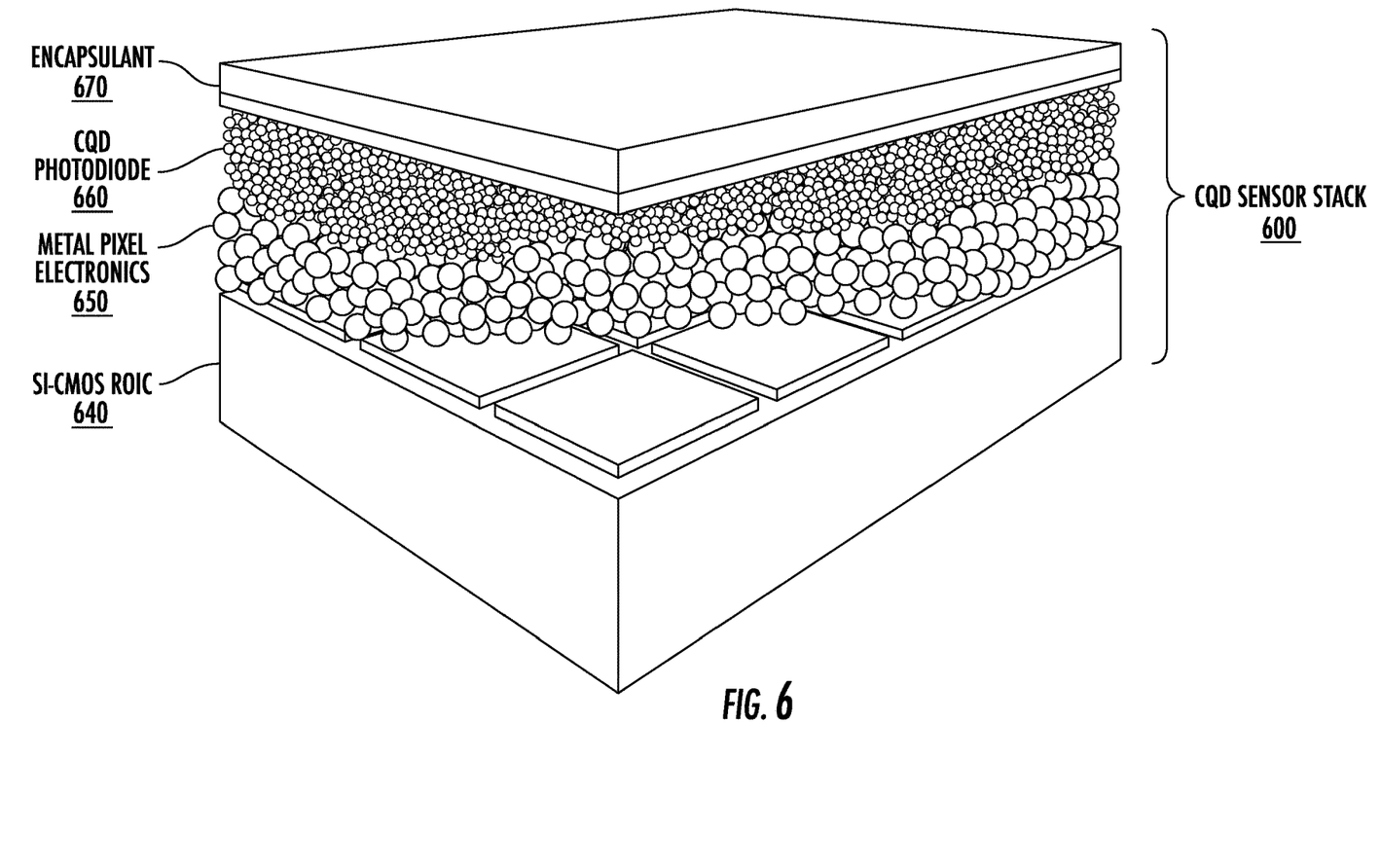
FIG. 6 is a cross section illustrating a colloidal quantum dot sensor stack in accordance with some embodiments of the present inventive concept.

Referring now to FIG. 6, an example colloidal quantum dot sensor stack that may be used in accordance with some embodiments of the present inventive concept will be discussed. The colloidal quantum dot sensor stack 600 includes a silicon-read out integrated circuit 640 having metal pixel electronics 650. The colloidal quantum dot photodiode 660 is provided on the electronics 650 and an encapsulant 670 on the photodiode 660. Example structures are provided in, commonly assigned, United States Patent Publication Nos. 2021/0288195 and 2022/0231244, the contents of which are hereby incorporated herein by reference as if set forth in their entirety. The colloidal quantum dot photodetector can be any colloidal quantum dot photodetector without departing from the scope of the present inventive concept.

Accordingly, some embodiments of the present inventive concept provide a photodetector structure built for depth sensing that is made using a colloidal quantum dot optical absorber; operates without active cooling; exhibits 10% to 90% rise/fall times less than 10 ns; has a bandwidth (BW) greater than 100 MHz; operates in response to light with wavelengths in the range from 900 nm to 2500 nm; may be a single element, linear array, or two dimensional array of detectors to enable high frame rates, high resolution sensing, and solid state systems without the need for scanning or spinning or other mechanical movement; made using a p-n junction formed between two adjacent colloidal quantum dot layers or a p-n junction formed between a colloidal quantum dot layer and a fullerene layer; and made using a p-n junction formed using at least one colloidal quantum dot material wherein the charge transport characteristics are dominated by diffusion processes and incorporate depletion widths less than 50 nm.

As discussed briefly above, some embodiments of the present inventive concept provide a high speed colloidal quantum dot photodiode structure that may be used as a photosensing element for optical depth sensing, ranging, gesture recognition, facial mapping, LIDAR and/or other three dimensional (3D) depth sensing systems.

In the drawings and specification, there have been disclosed exemplary embodiments of the inventive concept. However, many variations and modifications can be made to these embodiments without substantially departing from the principles of the present inventive concept. Accordingly, although specific terms are used, they are used in a generic and descriptive sense only and not for purposes of limitation, the scope of the inventive concept being defined by the following claims.

What is claimed is:

1. An optical depth sensing system, comprising:
    an active illumination source; and
    a colloidal quantum dot photodetector configured to receive light from the active illumination source, the colloidal quantum dot photodetector having colloidal quantum dots as a light sensing elements;
    wherein a signal output from the colloidal quantum dot photodetector has rise times that are less than 5.0 ns and fall times less than 10.0 ns.

2. The system of claim 1, wherein the active illumination source is one of a laser or a light emitting diode (LED).

3. The system of claim 1, wherein the system measures distances based on a measured return reflection of the active illumination source as detected by the colloidal quantum dot photodetector.

4. The system of claim 1, wherein the active illumination source produces photons in near infrared (NIR) or shortwave infrared (SWIR) spectral regions.

5. The system of claim 1, wherein the system is operated at low bias voltages and wherein the low bias voltages are between 0 mV and 1000 mV of applied reverse bias.

6. The system of claim 1, wherein the system operates without active cooling.

7. The system of claim 1, wherein the system exhibits a bandwidth greater than 100 MHz.

8. The system of claim 1, wherein the system operates in response to light with wavelengths in a range from 900 nm to 2500 nm.

9. The system of claim 1, wherein the colloidal quantum dot photodetector comprises a single element, linear array, or two dimensional array of detectors to enable high frame rates, high resolution sensing, and solid state systems.

10. The system of claim 1, wherein the system includes a p-n junction formed between two adjacent colloidal quantum dot layers or a p-n junction formed between a colloidal quantum dot layer and a fullerene layer.

11. The system of claim 10, wherein the p-n junction includes at least one colloidal quantum dot material.

12. The system of claim 1, wherein the colloidal quantum dot photodetector includes a p-n junction that operates with diffusion dominated charge transport characteristics and that has depletion widths less than 50 nm.

* * * * *